United States Patent
Miller et al.

(10) Patent No.: US 8,785,906 B2
(45) Date of Patent: Jul. 22, 2014

(54) LAMP WITH CONTROLLABLE SPECTRUM

(75) Inventors: Michael E. Miller, Honeoye Falls, NY (US); Paul J. Kane, Rochester, NY (US); Ronald S. Cok, Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 811 days.

(21) Appl. No.: 11/755,055

(22) Filed: May 30, 2007

(65) Prior Publication Data
US 2008/0296555 A1 Dec. 4, 2008

(51) Int. Cl.
*H01L 29/06* (2006.01)
*H01L 21/00* (2006.01)

(52) U.S. Cl.
USPC ............ 257/14; 257/59; 257/72; 257/73; 257/E21.019; 257/E29.05

(58) Field of Classification Search
USPC ......... 257/59, 72, 73, 76, 86, 88, 89, 98, 144, 257/152, E21.001, E29.005, 14; 438/22
See application file for complete search history.

(56) References Cited

U.S. PATENT DOCUMENTS

| | | | |
|---|---|---|---|
| 5,851,063 A | 12/1998 | Doughty et al. | |
| 7,122,842 B2 | 10/2006 | Hill | |
| 7,332,211 B1 * | 2/2008 | Bulovic et al. | 428/206 |
| 2004/0264193 A1 | 12/2004 | Okumura | |
| 2005/0051766 A1 | 3/2005 | Stokes et al. | |
| 2005/0092980 A1 | 5/2005 | Chen et al. | |
| 2005/0194608 A1 | 9/2005 | Chen | |
| 2006/0043361 A1 | 3/2006 | Lee et al. | |
| 2007/0001581 A1 | 1/2007 | Stasiak et al. | |
| 2010/0209602 A1 * | 8/2010 | Davis et al. | 427/157 |
| 2011/0263062 A1 * | 10/2011 | Bawendi et al. | 438/47 |

OTHER PUBLICATIONS

Zukauskas et al., "Optimization of white polychromatic seminconductor lamps", Applied Physics Letters, vol. 80, No. 2, pp. 234, 2002.
Damilano et al., "From visible to white light emission by GaN quantum dots on Si(111) substrate", Applied Physics Letters, vol. 74, p. 962, 1999.
Colorimetry (Official Recommendations of the International Commission on Illumination), No. 15, see Appendix E, Information on the Use of Planck's Equation for Standard Air, Vienna, Austria, 2004.
"Method of Measuring and Specifying Color-Rendering of Light Sources," CIE pub. No. 13.3, pp. 9-14, Vienna, Austria, 1995.

* cited by examiner

*Primary Examiner* — Cathy N Lam
(74) *Attorney, Agent, or Firm* — Raymond L. Owens (57) ABSTRACT

An area illumination inorganic electro-luminescent device including a substrate; and an array of one or more commonly addressed, light-emitting elements. Each commonly-addressed, light-emitting element includes a first electrode layer formed over the substrate, one or more light-emitting layers formed over the first electrode layer and a second electrode layer formed over the light-emitting layer. The light-emitting layers include multiple core/shell quantum dot emitters formed in a common polycrystalline semiconductor matrix, and a number of different core/shell quantum dot emitters emit light with a spectral power distribution having a peak and a FWHM bandwidth, such that the peak wavelengths differ by an amount less than or equal to the average FWHM bandwidth of the different core/shell quantum dot emitters within the range of 460 to 670 nm.

9 Claims, 11 Drawing Sheets

LAMP WITH CONTROLLABLE SPECTRUM

FIELD OF THE INVENTION

The present invention relates to the structure and manufacture of a lamp and, more particularly, to a lamp capable of producing a light with a spectral power distribution that approximates the spectral power distribution of daylight sources or other near blackbody radiators.

BACKGROUND OF THE INVENTION

Lamps capable of producing multiple colors of light are known to satisfy many applications; including lamps for general purpose lighting that allow "white" light to be generated in such a way to allow the user to adjust the correlated color temperature of the light. Lights with adjustable color temperature are further known for use in specialized lighting applications, such as camera strobes and motion picture lighting systems. Within this application space, it is most desirable to create lamps that provide an output having both calorimetric coordinates and spectral power distributions that match those of typical blackbody radiators, typical daylight lighting, or standard daylight sources. The calorimetric coordinates of natural light that exists during the day typically fall near a curve within CIE (Commission Internationale de l'Eclairage) chromaticity space referred to as the Planckian Locus or black body curve. Methods for calculating daylight spectra for color temperatures between 4000K and 25000K, have been specified within the art, CIE publication No. 15, *Colorimetry (Official Recommendations of the International Commission on Illumination)*, Vienna, Austria, 2004.). Standardized lighting conditions that are desirable to attain and fall near this curve; include those designated D50, D65, and D93, which correspond to daylight color temperatures of 5000K, 6500K, and 9300K, as well as so-called warmer lights, having lower correlated color temperatures, which are more similar in appearance to the light produced by tungsten lamps. In addition to having a lamp that is able to create light having the same calorimetric coordinates as these standardized lighting conditions, it is desirable to have a lamp that produces light having a spectral power distribution that matches the standardized spectral power distributions of these standardized light sources. One metric of the degree of match between the spectral power distribution of the light produced by a lamp and the spectral power distribution of these standard lighting conditions is the CIE color rendering index or CRI (CIE publication No. 13.3, *Method of Measuring and Specifying Color-Rendering of Light Sources*, Vienna, Austria, 1995, hereafter CIE Pub. 13.3).

The CRI is a standard method of specifying the degree to which the color appearance of a set of standard reflective objects illuminated by a given lamp matches the appearance of those same objects illuminated by light having the spectral power distribution to a specified reference source. CIE Pub. 13 provides for the computation of two color rendering indices, the so-called Special Color Rendering Index, $R_i$ and the General Color Rendering Index, $R_a$. The $R_i$ value is computed from the color difference between an individual color sample illuminated by the reference source and the lamp under test. Hence each color sample has its own associated $R_i$. CIE Publication 13 recommends a set of 14 color samples for testing illuminants. The General Color Rendering Index or $R_a$ value is the arithmetic mean of the $R_i$ values from the first 8 of these 14 color samples, and is the number commonly reported as the CRI value. Therefore, in the art the term CRI is widely used interchangeably with $R_a$, and will also be used in this disclosure to refer to $R_a$, unless otherwise noted.

Figure 10:
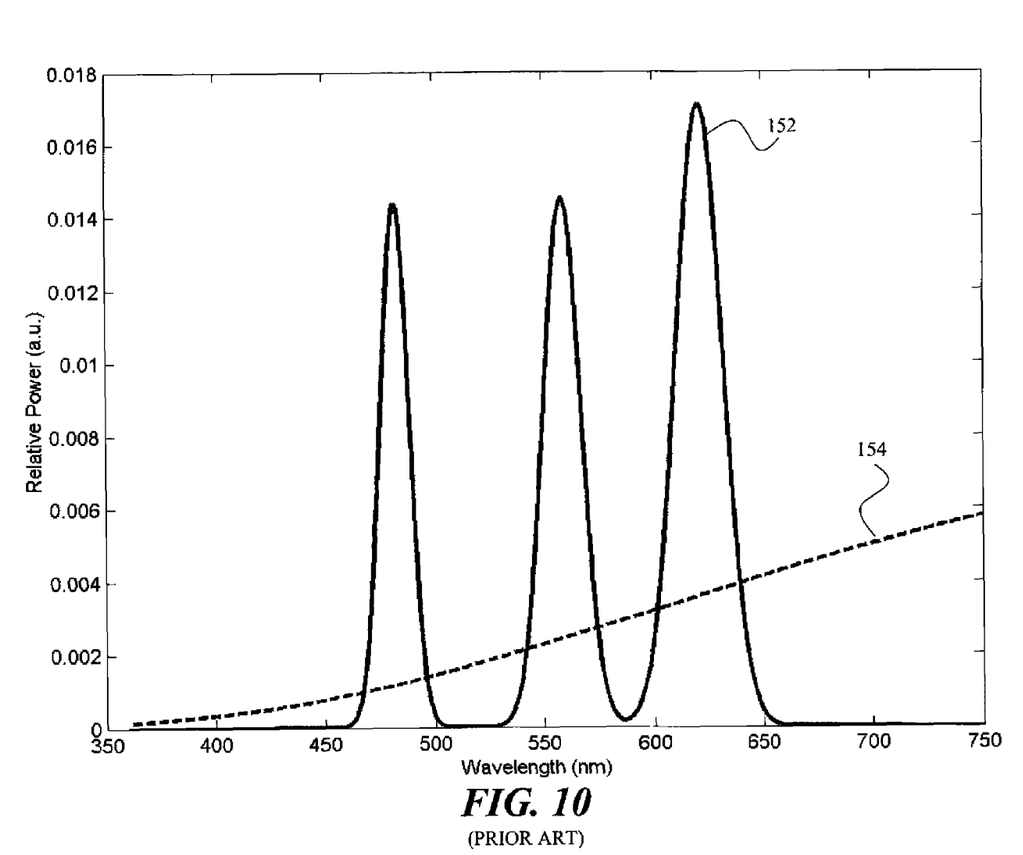
FIG. 10 is a plot illustrating the spectral power distribution of a prior art solution, as compared to a standard illuminant spectral power distribution.

In the prior art, lamps having a CRI of 80 or better provide a good match to the target spectral power distribution and are deemed to be of high quality. The disadvantages of describing the rendering capability of a light source using the CRI metric are: (1) the metric applies only to a group of eight color patches, which represent the reflectance spectrum of a limited set of reflective objects, none of which are particularly sensitive to metamerism; and (2) the metric is an average over eight $R_i$ values, and provides only a measure of central tendency, not of consistency. As a consequence, when one applies this metric to determine the goodness of fit between a pair of spectral power distributions, it is possible, especially when using light sources whose spectral power distributions are composed mainly of a few narrow peaks, to obtain a high CRI value even though they provide a very poor match to the overall curve shape of the target spectral power distribution. For example, FIG. 10 shows two prior art spectral power distributions, a broad spectrum 154, and another spectrum 152 that consists of a series of three intense narrowband components. Both spectra have the same integrated radiant power, though clearly their curve shapes do not match well. Another consequence is that colors outside the CIE-recommended set may exhibit significant metamerism problems when using spectral power distributions composed of intense narrowband components, an effect that might not be picked up by the CRI metric. Therefore, it is important when assessing such light sources, which may be found in inorganic electro-luminescent devices, to use alternate metrics to assess the light source. Other useful metrics may include simply the root mean squared error (RMSE) between the spectral power distributions of the light being designed and the spectral power distribution of a given, typically standard lamp, when these two spectral power distributions have been normalized to have a common area under their curves. Additionally, an expanded color rendering metric may be used if additional color patches, representing the reflectance spectrum of objects that are more sensitive to metamerism are included in its calculation. Such a metric can be based on the $R_i$ values of the additional color patches.

Figure 11:
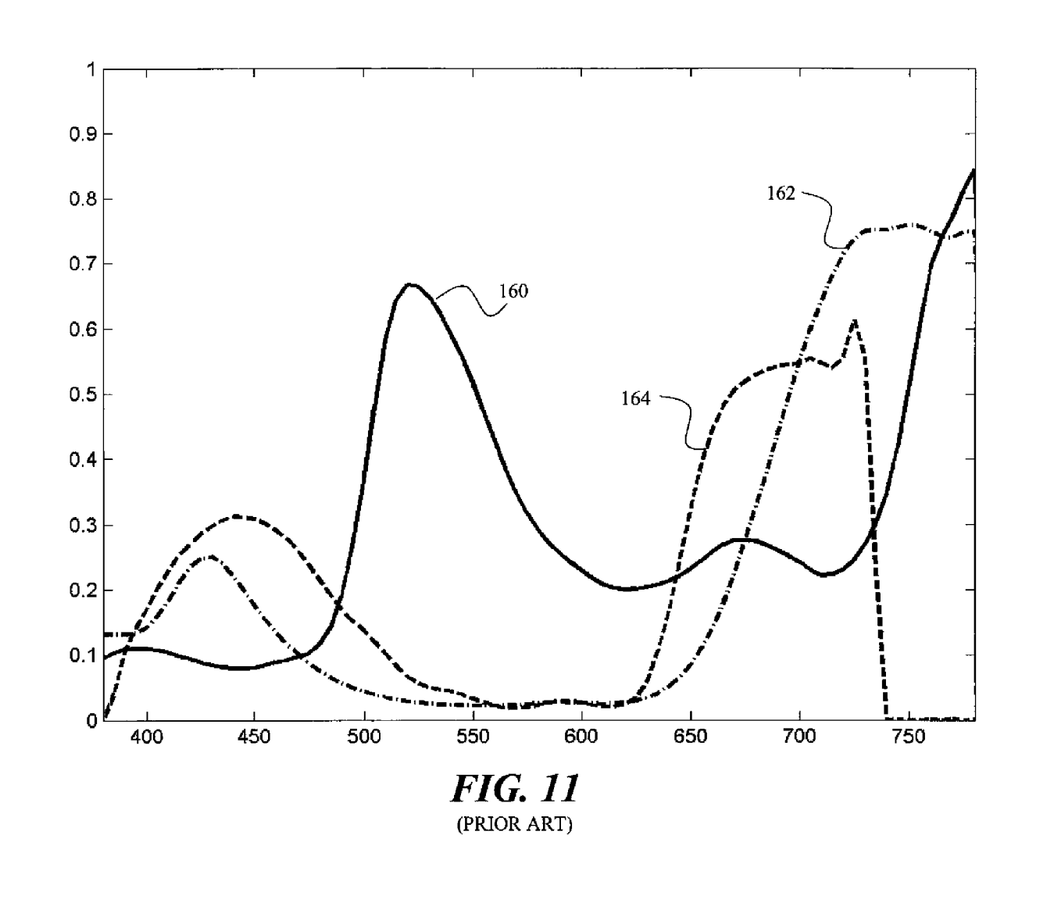
FIG. 11 illustrates spectral reflectance functions for three color patches useful in determining the likelihood of a light source to exhibit metamerism, as known in the prior art.

Lighting devices employing inorganic electro-luminescent devices have been discussed in the art that include only a few crystalline, inorganic, electro-luminescent diodes to form lamps having a high CRI. For instance, Doughty et al., in U.S. Pat. No. 5,851,063 entitled "Light-emitting diode white light source" has described light sources employing three crystalline light-emitting diodes to obtain CRI values of between 83 and 87, as well as lighting devices employing four crystalline light-emitting diodes that achieve a CRI of 96. While these devices achieve a CRI greater than 80, they do not provide a spectral power distribution that resembles the aim spectral power distribution of a black body radiator having the same correlated color temperature. This is shown in FIG. 10, which illustrates the prior art spectral power distribution 152 of a lamp having the peak wavelengths specified by Doughty and approximately the same spectral bandwidths as compared to the prior art spectral power distribution 154 of a 2800K blackbody radiator, where again, each source provides the same radiative power within the wavelength range shown. Again, the shapes of these two spectral power distributions are distinctly different from one another. As a result, when one calculates the $R_i$ values for additional patches having spectral reflectance functions, such as those from the prior art shown in FIG. 11 as 160, 162, and 164, values as low as −60 may be obtained. A large, negative CRI typically results for illuminants containing strong narrowband components combined with spectrally selective reflectors, i.e. when light sources that have gaps in their spectra illuminate highly saturated colors. These spectral reflectance functions are from saturated cyan and purple colors that are not unusual in clothing, graphic arts or decorative materials. Further, the RMSE between the normalized spectral power distributions of the lamp provided by Doughty and the reference source is $4.9 \times 10^{-3}$, which is relatively high. It should be noted that Doughty also provides a lamp specification including four LEDs having four unique peak wavelengths, which performs better in this respect. However, the Special Color Rendering Index for the three patches whose spectra are represented in FIG. 11 is still only 46 and the RMSE is $4.5 \times 10^{-3}$.

A similar disclosure is provided in "Optimization of white polychromatic semiconductor lamps" by Zukauskas et al (Applied Physics Letters Vol. 80, No. 2, p. 234, 2002). This article also discusses the fact that relatively high CRI values can be obtained with light output from 2, 3, or 5 crystalline LEDs, with higher CRI values obtained for the lights with larger numbers of crystalline LEDs. However, once again the resulting spectral power distributions have a small number of narrowband components, and while they provide high CRI values when calculated using the standard eight color patches, they do not provide particularly good matches to the typically desired, daylight, blackbody, or incandescent spectral power distributions. For the light source having five narrowband components, which provides the highest CRI, the $R_i$ values for the three spectral distributions shown in FIG. 11 are as low as 49 and once again the RMSE is large, having a value of $2.4 \times 10^{-3}$.

It is important to note that each of these papers discuss the use of light emission from crystalline electro-luminescent diodes. These devices are typically packaged such that a single crystal, emitting light having a narrow wavelength band, is packaged as a compete device. Several of these devices are then selected and packaged together to form lamps as discussed by Zukauskas and Doughty. The requirements to form several separate packaged single crystal electro-luminescent diodes and to further select a number of these devices and package them into lamps is expensive and manually intensive, making it extremely expensive to include more than a few single crystal, electro-luminescent devices in each lamp.

Electro-luminescent devices having broader band light emission are also known. For example, Okumura in US Publication No. 2004/264193, entitled "Color Temperature-Regulable (sic) LED Light" discusses a white LED, which is formed from a phosphorescent substance that emits broadband light when excited by a blue or ultraviolet crystalline electro-luminescent device. While such embodiments provide a much broader bandwidth emission, it is not possible to tune the relative amplitude of the spectral power distribution at important locations and, therefore, it is not possible to accurately tune the output of such a device to obtain a good spectral match to a desired spectral power distribution. Further, energy is lost during the conversion of the blue or ultraviolet light to longer wavelength colors of light.

A recent article, "From visible to white light emission by GaN quantum dots on Si(111) substrate" by B. Damilano et al. (Applied Physics Letters Vol. 75, p. 962, 1999), has discussed stacking multiple layers of quantum dots, the individual layers being tuned to complementary wavelength bands, to achieve the emission of white light through photo-luminescence. Electro-luminescent white light emission was not demonstrated, nor was continuous color tuning with a fixed material set. Further, this device did not match or attempt to match any desired spectrum, and the emission spectra of the devices were generally composed of a few narrowband peaks over the wavelength range that was shown.

US 2006/0043361 discloses a white light-emitting organic-inorganic hybrid electro-luminescence device. The device comprises a hole-injecting electrode, a hole-transport layer, a semiconductor nanocrystal layer, an electron transport layer and an electron-injecting electrode, wherein the semiconductor nanocrystal layer is composed of at least one kind of semiconductor nanocrystals, and at least one of the aforementioned layers emits light to achieve white light emission. The semiconductor nanocrystal layer of this device may also be composed of at least two kinds of nanocrystals having at least one difference in size, composition, structure or shape. Organic materials are employed for the transport layers, whereas inorganic materials are employed for the nanocrystals and the electrodes. While such a device may be used to create white light, it does not address the need to vary the color of this white light source or to control the spectral power distribution of the white light source.

U.S. Pat. No. 7,122,842 discloses a light emitting device that produces white light, wherein a series of rare-earth doped group IV semiconductor nanocrystals are either combined in a single layer or are stacked in individual RGB layers to produce white light. In one example, at least one layer of Group TI or Group VI nanocrystals receives light emitted by the Group IV rare-earth doped nanocrystals acting as a pump source, the Group TI or Group VI nanocrystals then fluorescing at a variety of wavelengths. This disclosure also does not demonstrate color tuning or a method to control the spectral power distribution of the white light source.

US 2005/0194608 discloses a device having a broad spectral power distribution $Al_{(1-x-y)}In_yGa_xN$ white light emitting device which includes at least one blue-complementary light quantum dot emitting layer having a broad spectral power distribution and at least one blue light emitting layer. The blue-complementary quantum dot layer includes plural quantum dots, the dimensions and indium content of which are manipulated to result in an uneven distribution so as to increase the FWHM of the emission of the layer. The blue light-emitting layer is disposed between two conductive cladding layers to form a packaged LED. Various examples are described in which the blue-complementary emission is achieved by means of up to nine emitting layers to provide a broad spectral distribution, and the blue emission is achieved by up to four blue emitting layers. However, all examples demonstrate the presence of two distinct narrowband components, to provide complementary blue and yellow colors. The authors do not discuss a means to achieve a relatively continuous broadband spectral power distribution as is required for the spectral power distributions of standard daylight, blackbody, or tungsten emitters.

There is a need, therefore, for a less expensive lamp that provides a good spectral match, especially for typical daylight or near blackbody radiators, including tungsten. As such, the lamp should provide a spectral power distribution having higher special color rendering index values and lower root mean squared errors when compared to standard near-blackbody spectral power distributions.

SUMMARY OF THE INVENTION

The above need is met by providing an area illumination inorganic electro-luminescent device that includes a substrate and an array of one or more commonly addressed, light-emitting elements. Each commonly-addressed, light-emitting element includes a first electrode layer formed over the substrate, one or more light-emitting layers formed over the first electrode layer and a second electrode layer formed over the light-emitting layer. The light-emitting layers include multiple core/shell quantum dot emitters formed in a common polycrystalline semiconductor matrix, and a number of different core/shell quantum dot emitters emit light with a spectral power distribution having a peak and a FWHM bandwidth, such that the peak wavelengths differ by an amount less than or equal to the average FWHM bandwidth of the different core/shell quantum dot emitters within the range of 460 to 670 nm.

Another embodiment of the present invention provides an area illumination inorganic electro-luminescent device with a General Color Rendering Index of 80 or greater. Again, the device includes an array of one or more commonly addressed, light-emitting elements, each commonly-addressed, light-emitting element having:

1) a first electrode layer formed over the substrate,
2) one or more light-emitting layers formed over the first electrode layer, and
3) a second electrode layer formed over the light-emitting layer.

The one or more light-emitting layers include a plurality of core/shell quantum dot emitters having narrowly spaced spectral power distributions, the spectral power distributions including a peak and a FWHM bandwidth. The peak wavelengths of the spectral power distributions of light produced by at least a subset of the different core/shell dot emitters are spaced such that the minimum distance between any two peak wavelengths is less than 1.1 times the average FWHM bandwidth between 460 and 670 nm, and such that the electro-luminescent device produces white light having a General Color Rendering Index of 80 or greater.

DETAILED DESCRIPTION OF THE INVENTION

Figure 1:
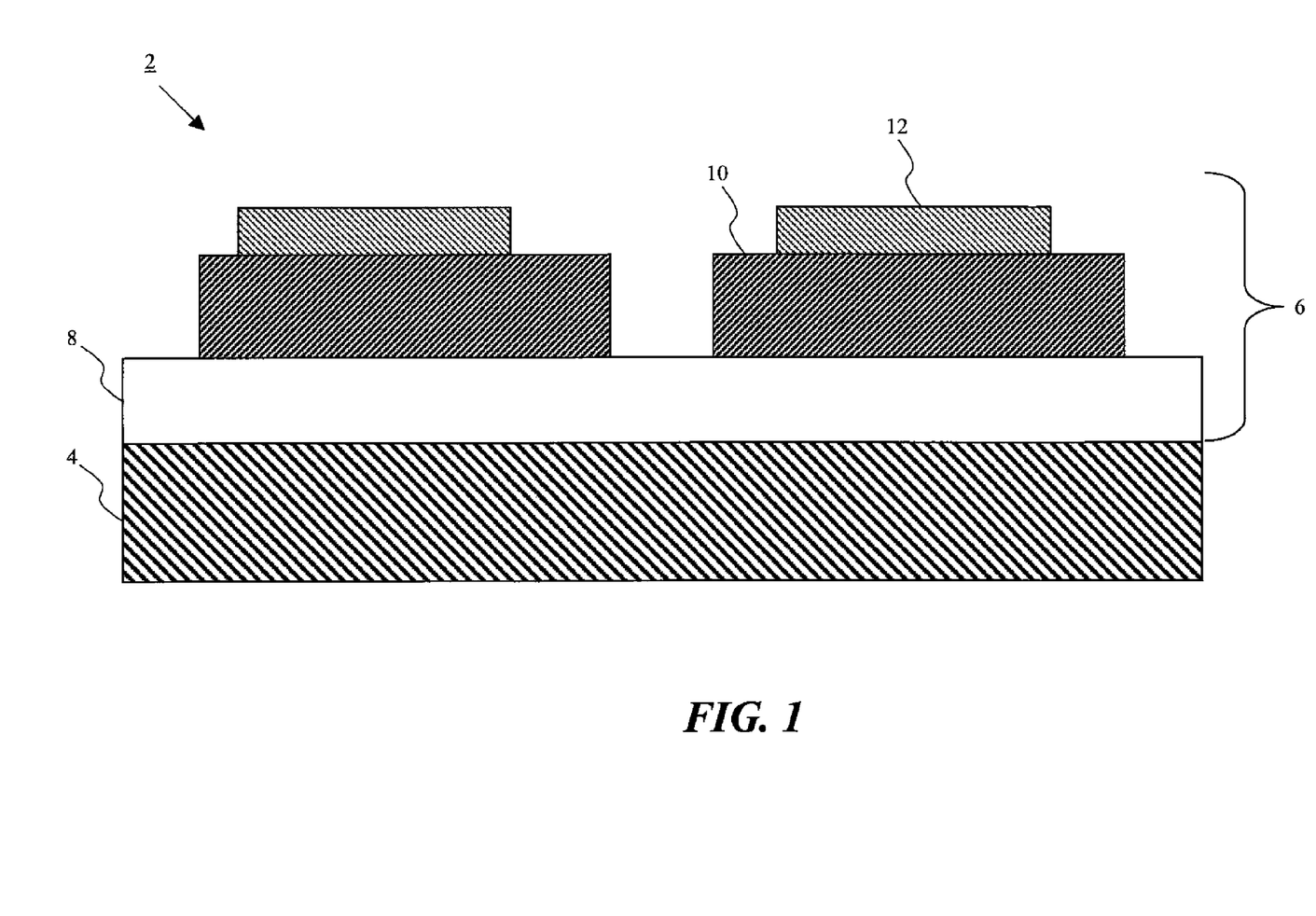
FIG. 1 is a cross-section of an area illumination electro-luminescent device according to one embodiment of the present invention.
Figure 2:
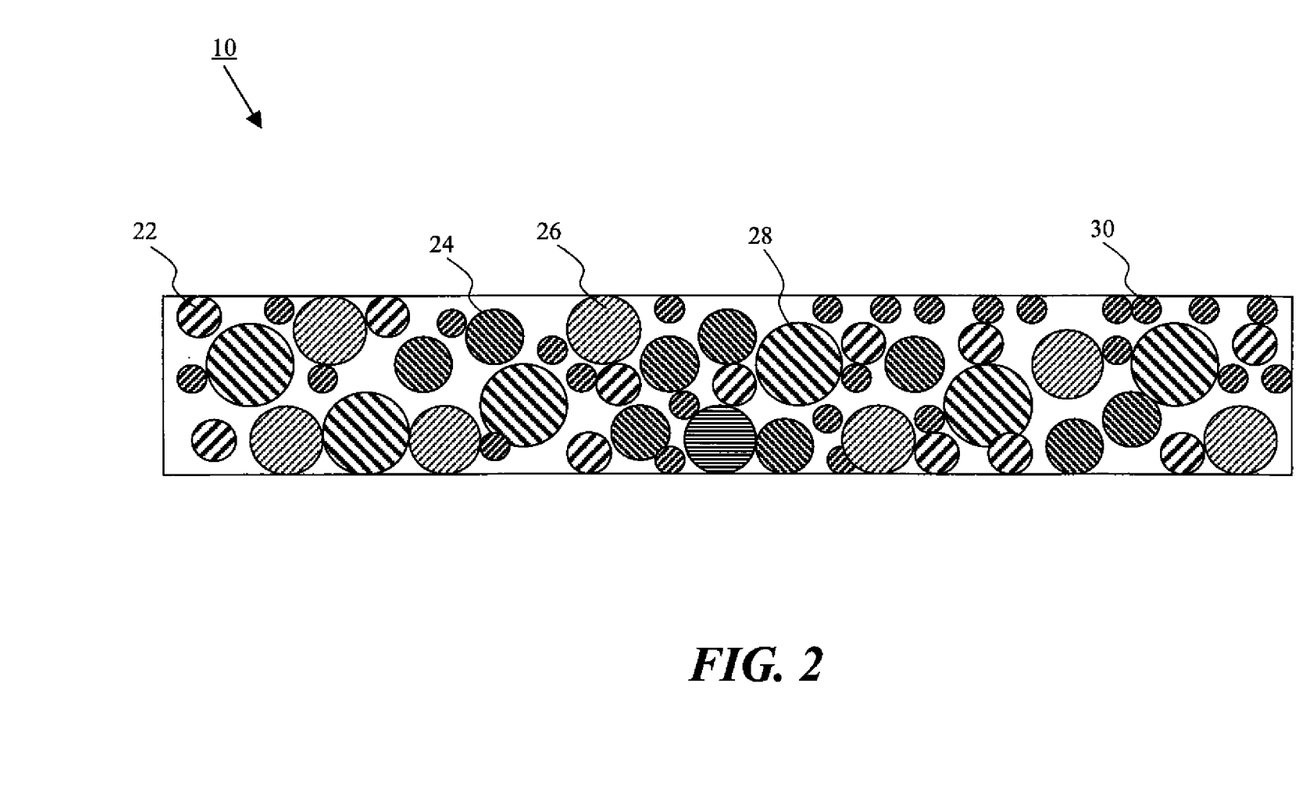
FIG. 2 is a schematic of a light-emitting layer according to one embodiment of the present invention.

The present invention provides an area illumination inorganic electro-luminescent device having a spectral power distribution that approximates the spectral power distribution of a desired light source. A cross-section of the area illumination electro-luminescent device 2 is shown in FIG. 1. As shown in this figure, the electro-luminescent device is comprised of a substrate 4 and an array of one or more commonly-addressed, light-emitting elements 6. Each of the commonly-addressed, light-emitting elements 6 includes a first electrode layer 8 formed over the substrate 4, one or more light-emitting layers 10 formed over the first electrode layer 8 and a second electrode layer 12 formed over the light-emitting layer 10. To provide a spectral power distribution that has a good approximation to the spectral power distribution of a desired light source, the one or more light-emitting layers 10 each include one or more core/shell quantum dot emitters, formed in a common polycrystalline semiconductor matrix. The one or more light-emitting layers 10 together include a plurality of core/shell quantum dot emitters 22-30, as shown in FIG. 2. In desirable embodiments, the light-emitting layers 10 will each contain a plurality of these core/shell quantum dot emitters, which are formed in a common polycrystalline semiconductor matrix.

The presence of a plurality of core/shell quantum dot emitters within each light-emitting element 6 and desirably within each light-emitting layer 10 are important when forming commercially practical devices of the present invention. These devices will often include more than five and often more than ten different core/shell quantum dots to provide desirable spectral power distributions. A comparable lighting device could be made using competitive technology to the coatable core/shell quantum dot technology, such as crystalline electro-luminescent diodes. For instance, lighting devices could be formed by employing five, ten, or more different discrete crystalline LEDs as are well known in the prior art. However, such a device requires the steps of separately forming each of the different discrete crystalline LEDs and the assembly of the device from these discrete LEDs. The present invention provides a method not previously contemplated in the prior art, whereby a colloidal mixture of different core/shell quantum dot emitters may be made and deposited onto a common substrate, significantly reducing the complexity and cost of manufacture for such a device. Further, since a light-emitting element made according to the present invention can be driven from a power supply with one current, the electronics will be much simpler than that required for the prior art. The electronics required for a prior art area lighting device assembled from discrete LEDs, requires additional electrical components to form a lamp having similar performance since these LEDs will typically require different currents.

FIG. 2 shows a typical light-emitting layer 10 of the present invention. As shown in FIG. 2, the light-emitting layer contains numerous different core/shell quantum dot emitters, each different core/shell quantum dot emitter having a different spectral power distribution. As shown in FIG. 2, the light-emitting layer may achieve this performance by including different core/shell quantum dot emitters having different sizes, such as core/shell quantum dot emitters 22, 24, 26, and 28. Typically, the larger core/shell quantum dot emitters, such as 26 and 28, will emit light having longer wavelengths than the smaller core/shell quantum dot emitters, such as 22 and 24. As will be discussed in more detail shortly, the light-emitting layer 10 may also contain other particles 30 that are not core/shell quantum dot emitters 22, 24, 26, 28 but are present to aid the flow of current through the polycrystalline semiconductor matrix to the core/shell quantum dot emitters.

Figure 3:
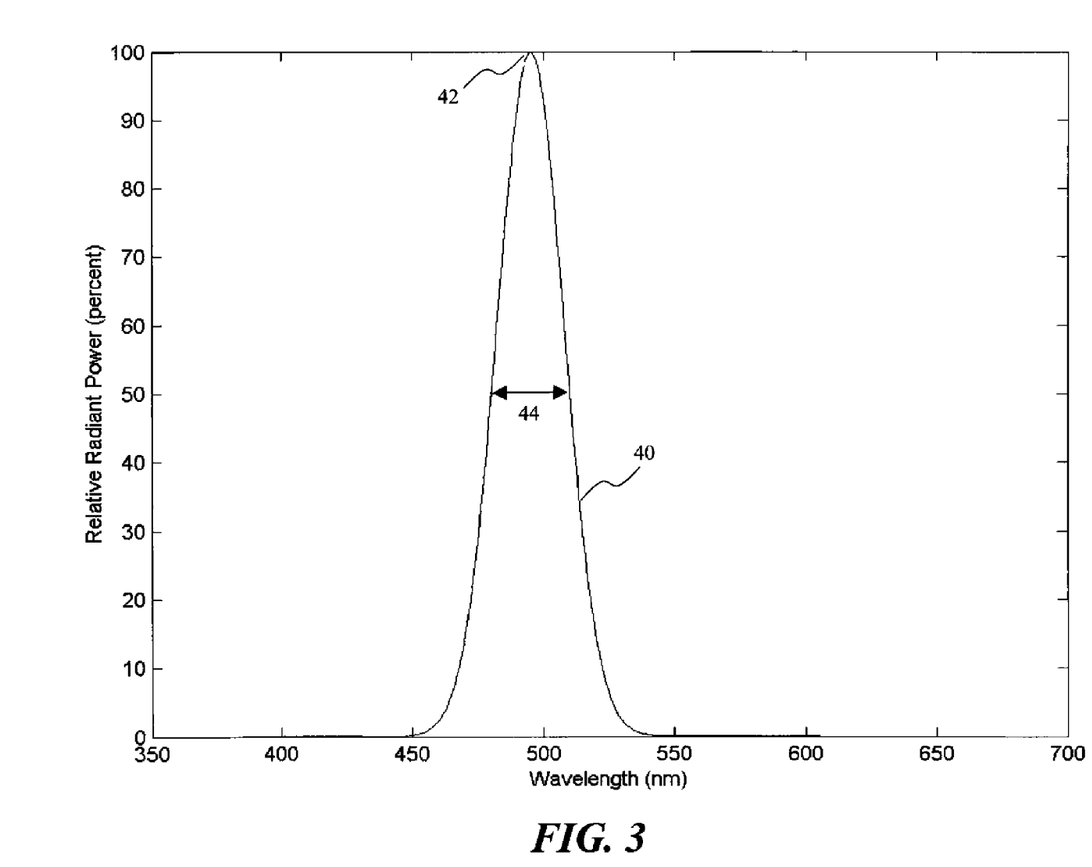
FIG. 3 is a plot of the spectral power distribution of a single core/shell quantum dot emitter according to one embodiment of the present invention.

Within the present invention, each of the different core/shell quantum dot emitters 22, 24, 26, 28 emits light having a spectral power distribution as shown in FIG. 3. As shown in FIG. 3, the spectral power distribution 40 of each of the different core/shell quantum dot emitters includes a peak wavelength 42, in this example illustrated at 495 nm, and a full-width at half maximum amplitude spectral bandwidth 44 (referred to as the FWHM bandwidth). It should be noted, that while any individual core/shell quantum dot emitter emits light at only a single wavelength, known synthesis methods generally produce core/shell quantum dot emitters with a size distribution. This size distribution, intended or unintended, of core/shell quantum dots then produces light having a spectral power distribution 40, which will typically have a variation in size that will produce a FWHM bandwidth 44, typically on the order of 30 nm. Therefore devices of the present invention will typically have a FWHM bandwidth of 50 nm or less. Within the area illumination inorganic electro-luminescent device of the present invention the peak wavelength 42 of the spectral power distributions of light produced by each of the different core/shell quantum dot emitters are narrowly spaced such that the minimum distance between any two peak wavelengths is less than 1.1 times the average FWHM bandwidth within the wavelength range of 460 and 670 nm, allowing the electro-luminescent device to produce white light having both a CRI of 80 or greater, and Special Color Rendering Index Values $R_i$ that are consistently 80 or greater for a wide variety of color samples. In some embodiments, the electro-luminescent device will produce a spectral power distribution that will have a root mean squared error of less than $1 \times 10^{-3}$ and desirably less than $5 \times 10^{-4}$, when compared to the spectral power distribution of a daylight or near blackbody emitters having equivalent correlated color temperatures, and wherein the two spectral power distributions have the same integrated power between 350 and 750 nm. In some electro-luminescent devices, the peak wavelengths between two neighboring peak wavelengths will differ by a value equal to or less than the average FWHM bandwidth 44 of the different core/shell quantum dot emitters, within the range of 460 to 670 nm.

Figure 4:
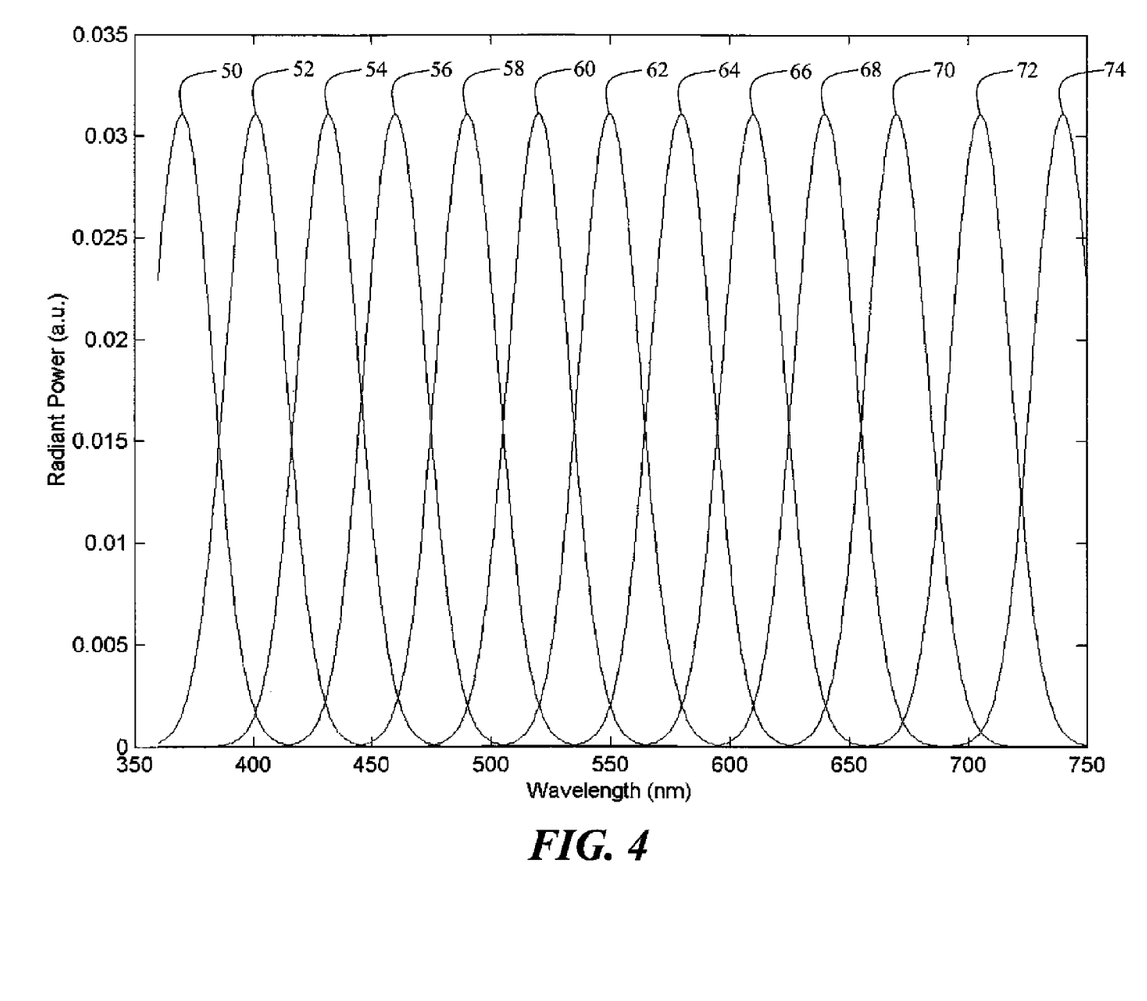
FIG. 4 is a plot of the spectral power distributions of a group of core/shell quantum dot emitters according to one embodiment of the present invention.

FIG. 4 shows one exemplary group of spectral power distributions of a group of core/shell quantum dot emitters in one or more commonly-addressed, light-emitting elements of the present invention. This figure shows a group of thirteen spectral power distributions 50 through 74, each spectral power distribution having FWHM bandwidths of 30 nm and with peak wavelengths located at 370, 401, 432, 460, 490, 520, 550, 580, 610, 640, 670, 705, and 740 nm. As shown, the spectral power distributions 56 through 70 produce light with peak wavelengths in the range of 460 to 670 nm and these peak wavelengths are separated by 30 nm, which is equal to the FWHM bandwidths, providing peak wavelengths with minimum separations that are less than 1.1 times the average FWHM bandwidth and equal to the FWHM bandwidths. One should also note that the two neighboring peak wavelengths differ by a value larger than the average FWHM bandwidth. Note, however, that outside the wavelength range of 460 to 670 nm the peak wavelengths are spaced differently, and generally separated by larger distances. Therefore, the separation between the peak wavelengths of these spectral power distributions is equal to or less than the FWHM bandwidths only within the range of 460 to 670 nm, but has larger separations outside of this range.

Figure 5:
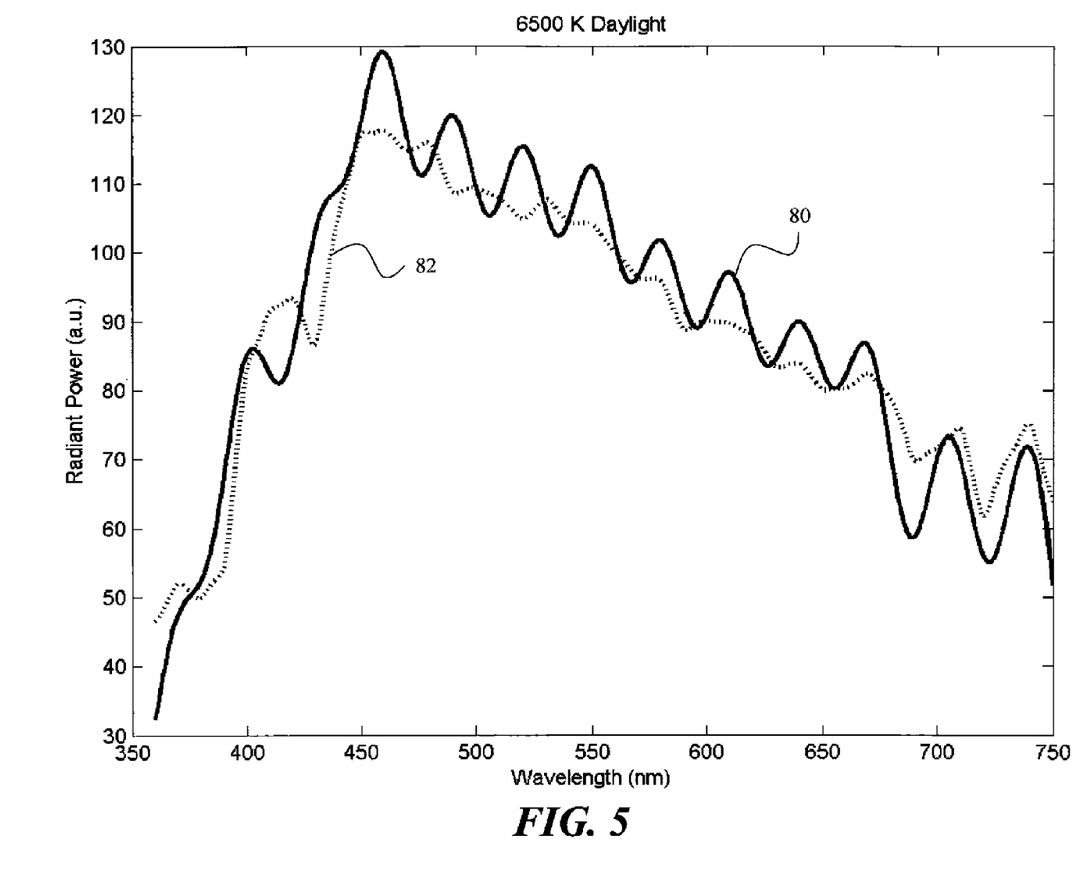
FIG. 5 is a plot of the spectral power distribution of an area illumination electro-luminescent device according to one embodiment of the present invention, as compared to a standard illuminant spectral power distribution known in the art.

Within the present invention, the group of different core/shell quantum dot emitters each produce light within the one or more commonly-addressed, light-emitting elements, which may be combined to provide a single spectral power distribution. Further, characteristics of this light-emitting layer, such as the concentration of the different core/shell quantum dot emitters may be adjusted to control the relative amount of radiant energy produced by each of the different core/shell quantum dot emitters. A resulting single spectral power distribution may then be created to provide white light. FIG. 5 illustrates a spectral power distribution 80, which is created by combining the light from the correct proportion of individual spectral power distributions 50 through 74 of the core/shell quantum dot emitters depicted in FIG. 4. Also shown in FIG. 5 is the spectral power distribution 82 for the standard daylight illuminant with a correlated color temperature of 6500K as defined by the CIE. Note that the spectral power distribution 80 provides a relatively close match to the standard spectral power distribution 82. The fit of the spectral power distribution 80, which is created by the area electro-luminescent device of the present invention, to the spectral power distribution 82 for the standard D65 daylight illuminant, may be demonstrated by calculating the Color Rendering Index for the power distribution 80, using the power distribution 82 as the reference. For the spectral power distribution 80, the CRI value is 97 with respect to the standard spectral power distribution 82.

As demonstrated within this example, the area illumination electro-luminescent device provides a spectral power distribution that is a relative match to the spectral power distribution of a standard daylight light source with a Color Rendering Index greater than 80. Note that to calculate CRI, it is necessary to provide a reference spectrum. A reference may be determined during assessment simply by selecting the reference as the daylight or blackbody source with the closest correlated color temperature.

To achieve a CRI of at least 80, and an $R_i$ value consistently greater than 80, the area illumination electro-luminescent device provides different core/shell quantum dot emitters which emit light having spectral power distributions with peak wavelengths that differ by a wavelength value equal to or less than the average FWHM bandwidth 44 of the different core/shell quantum dot emitters within the range of 460 to 670 nm. In addition to this criterion, the emitter provides three additional core/shell quantum dot emitters providing three spectral power distributions having peak wavelengths lower than 460 nm and two spectral power distributions having peak wavelengths greater than 670 nm.

By applying the same group of core/shell quantum dot emitters having the same peak wavelengths, one can create an area illumination electro-luminescent device which has a spectral power distribution that provides a good match to any of the standard daylight light sources provided by the CIE. To accomplish this, it is only necessary to adjust the amplitude of each of the spectral power distributions. This may be accomplished within a device of the present invention by, for example, adjusting the relative concentrations of the different core/shell quantum dot emitters within the light-emitting layer 10. Table 1 shows CRI values that may be attained for CIE daylight spectral power distributions for some typical correlated color temperatures. As shown in Table 1, spectral power distributions may be attained for devices of the present invention that are between 94 and 97, which are all larger than 80. Note that the minimum $R_i$ value is greater than 90 even when the spectral reflectance functions shown in FIG. 11 are added to the spectral reflectance functions recommended for the calculation of the CRI value. Further, in this example, the RMSE values are all less than $2.5 \times 10^{-4}$.

TABLE 1

| Correlated Color Temperature | CRI | Min($R_i$) | RMSE |
| --- | --- | --- | --- |
| 4000 K | 94 | 92 | $1.9 \times 10^{-4}$ |
| 5000 K | 96 | 94 | $1.8 \times 10^{-4}$ |
| 6500 K | 97 | 95 | $1.8 \times 10^{-4}$ |
| 9300 K | 97 | 96 | $2.0 \times 10^{-4}$ |
| 10000 K | 97 | 96 | $2.0 \times 10^{-4}$ |
| 15000 K | 96 | 95 | $2.2 \times 10^{-4}$ |
| 20000 K | 95 | 95 | $2.3 \times 10^{-4}$ |
| 25000 K | 95 | 94 | $2.4 \times 10^{-4}$ |

Table 1 demonstrates a good spectral match of a device of the present invention as created by overlapping the spectral power distributions of the core/shell quantum dot emitters by a distance equal to their FWHM bandwidths within the range of 460 to 670 nm. Good performance can be attained if the spectral power distributions of the core/shell quantum dot emitters overlap by slightly less. For example, Table 2 shows the results that can be attained if the spectral power distributions of the core/shell quantum dot emitters within the range of 460 and 670 nm are overlapped by a factor of 1.1 times the average bandwidths. Specifically, core/shell quantum dot emitters have FWHM bandwidths of 30 nm and peak wavelengths of 370, 401, 422, 455, 488, 511, 544, 577, 610, 643, 676, 705, and 740 nm were applied. As shown in Table 2, both the CRI values and the minimum special rendering index values are greater than 80 even when the spectral reflectance functions shown in FIG. 11 are added to the spectral reflectance functions recommended for the calculation of the CRI value. Further, RMSE values less than $3.5 \times 10^{-4}$ are attained.

TABLE 2

| Correlated Color Temperature | CRI | Min($R_i$) | RMSE |
| --- | --- | --- | --- |
| 4000 K | 95 | 90 | $2.9 \times 10^{-4}$ |
| 5000 K | 89 | 87 | $3.1 \times 10^{-4}$ |
| 6500 K | 87 | 85 | $3.1 \times 10^{-4}$ |
| 9300 K | 86 | 85 | $3.1 \times 10^{-4}$ |
| 10000 K | 86 | 85 | $3.1 \times 10^{-4}$ |
| 15000 K | 86 | 84 | $3.1 \times 10^{-4}$ |
| 20000 K | 86 | 84 | $3.0 \times 10^{-4}$ |
| 25000 K | 86 | 83 | $3.0 \times 10^{-4}$ |

Each of the standard daylight spectral power distributions are smoothly varying between 460 and 670 nm. To achieve a CRI greater than 80 and a smoothly varying spectrum by combining light from different, relatively narrow, spectral power distributions (i.e., spectral power distributions having small FWHM bandwidths), it is necessary to provide a significant degree of overlap between the different, relatively narrow, a fact which was previously unappreciated in the prior art. The impact of the overlap may be demonstrated by creating less overlap between the spectral power distributions between 460 and 670 nm. To achieve less overlap, one of the spectral power distributions 50 through 74 may be removed in this range and a larger space provided between the peak wavelengths 42 within the range of 460 to 670 nm. In this example, spectral power distributions having peak wavelengths of 370, 401, 432, 460, 495, 530, 565, 600, 640, 670, 705, and 740 nm were applied. Note that the peak wavelengths of these emitters within the range of 460 to 670 are separated by 35 nm, which is larger than 1.1 times the 30 nm FWHM bandwidths. As in the previous example, the maximum color rendering index values that may be attained for the same correlated color temperatures shown in the previous two tables, are shown in Table 3. Note that when the overlap of the spectral power distributions for each of the different core/shell quantum dot emitters is reduced, the CRI values are reduced from values in the high 90s to values between 68 and 83 and the minimum $R_i$ values for the extended patch set range between 58 and 73. Further the RMSE values are $3.4 \times 10^{-4}$ or greater. As this example illustrates, it is important to provide significant overlap of the spectral power distributions for the emission from the different core/shell quantum dot emitters in order to achieve a high CRI and consistent $R_i$. This requirement for overlap may be achieved by separating the peak wavelengths of the different core/shell quantum dot emitters by no more than the average FWHM bandwidth, over a wavelength range that the target spectral power distribution is smoothly varying.

TABLE 3

| Correlated Color Temperature | CRI | Min($R_i$) | RMSE |
| --- | --- | --- | --- |
| 4000 K | 83 | 73 | $3.6 \times 10{-4}$ |
| 5000 K | 77 | 68 | $3.5 \times 10{-4}$ |
| 6500 K | 74 | 63 | $3.4 \times 10{-4}$ |
| 9300 K | 71 | 61 | $3.4 \times 10{-4}$ |
| 10000 K | 71 | 60 | $3.4 \times 10{-4}$ |
| 15000 K | 69 | 59 | $3.4 \times 10{-4}$ |
| 20000 K | 69 | 58 | $3.4 \times 10{-4}$ |
| 25000 K | 68 | 58 | $3.5 \times 10{-4}$ |

Figure 6:
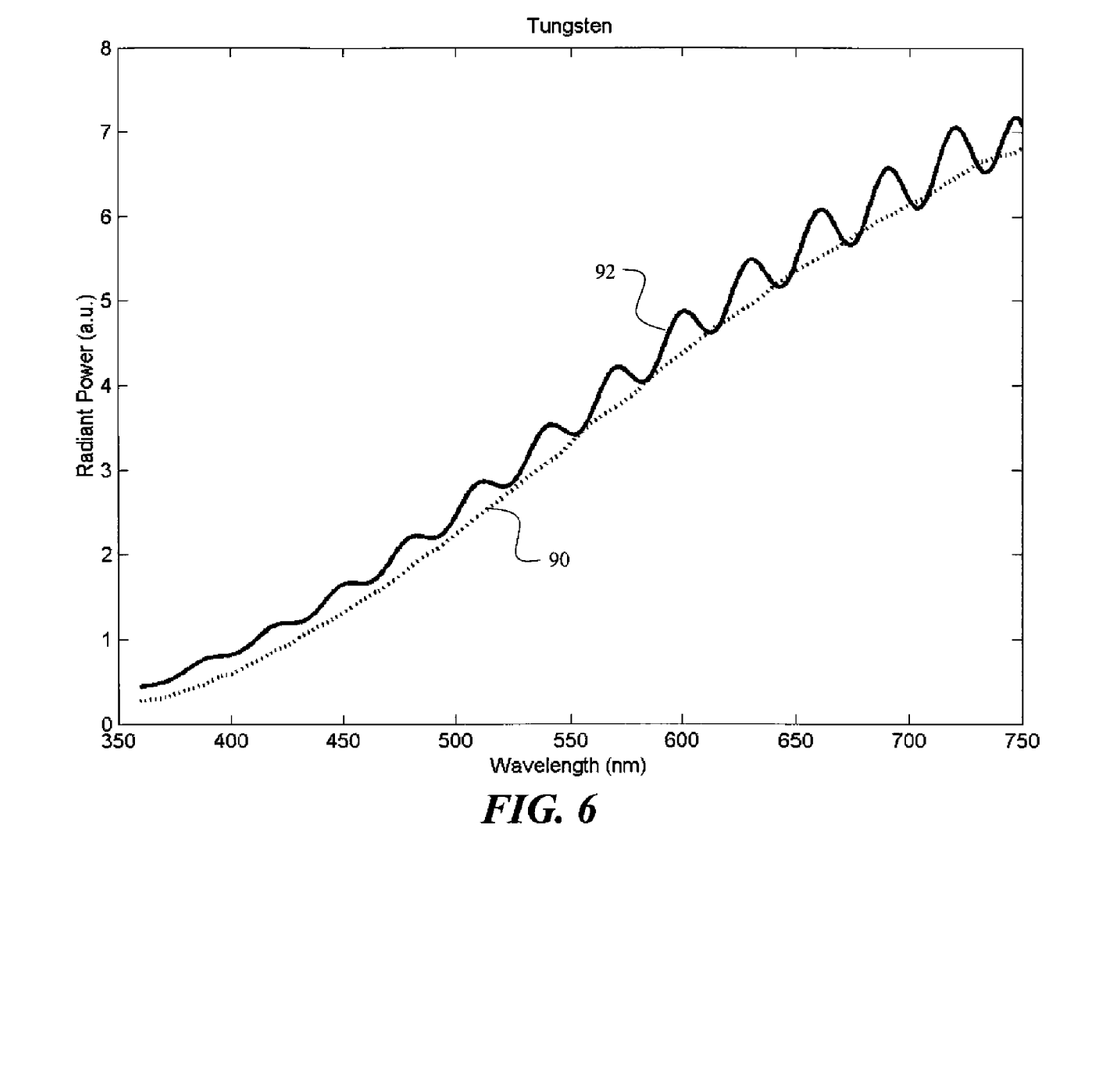
FIG. 6 is a plot of the spectral power distribution of an area illumination electro-luminescent device according to one embodiment of the present invention, as compared to a standard illuminant spectral power distribution known in the art.

By applying this principle of overlapping the spectral power distributions of the different core/shell quantum dot emitters within the wavelength range of a target spectral power distribution, one can also provide an area illumination electro-luminescent device that has a spectral power distribution that provides a good match to the spectral power distribution of a conventional incandescent lamp or any conventional blackbody emitter. FIG. 6 shows the spectral power distribution 90 of a conventional incandescent lamp. Note that this aim spectral power distribution, which is very similar in shape to standard blackbody radiators, varies smoothly not only over the range from 460 to 670 nm but also over the entire visible range. Such a spectral power distribution may be attained by providing a light-emitting layer 10 containing numerous different core/shell quantum dot emitters, wherein the spectral power distributions of the individual different core/shell quantum dot emitters overlap such that the peak wavelengths differ by a wavelength value equal to or less than the average FWHM bandwidth of the different core/shell quantum dot emitters. For example, an area illumination electro-luminescent device of the present invention, which employs different core/shell quantum dot emitters of 30 nm FWHM bandwidth, may employ emitters having peak wavelengths at 360, 390, 420, 450, 480, 510, 540, 570, 600, 630, 650, 680, 720, and 750 nm. By employing emitters at these spectral locations with the proper proportions, a spectral power distribution 92 is obtained. When compared to the original tungsten emitter, such a device would have a CRI of 87, which is well above 80; would have a minimum $R_i$ value of 81 for the extended patch set, which is above 80, and would have a RMSE of $1.5 \times 10^{-4}$ when compared to the spectral power distribution of a blackbody source having the same correlated color temperature as the tungsten source. Based upon these criteria, the resulting device would therefore provide a high-quality lighting device for approximating the illumination of a tungsten bulb. Likewise, by employing similar groups of different core/shell quantum dot emitters to fit the standard blackbody emitters, similar fits may be obtained by employing peak wavelengths that differ by a wavelength value equal to or less than the average FWHM bandwidth.

It should be noted that in each of the past examples, the FWHM bandwidth provided by each of the different core/shell quantum dot emitters was the same for each of the different core/shell quantum dot emitters. However, this is not a requirement of the invention. Instead, it is possible for each of the different core/shell quantum dot emitters to have a different FWHM bandwidth. The separation of the peak wavelengths should be no more than the average FWHM bandwidth. When the FWHM bandwidths are all the same, all are by definition equal to the average. However, when the FWHM bandwidths are not all the same, the average is computed from the FWHM bandwidths of any core/shell quantum dot emitter and the FWHM bandwidths of one or both of its neighbors having the closest peak wavelength frequency. Alternately, the average is computed from the FWHM bandwidths of all of the different core/shell quantum dot emitters within the area illumination electro-luminescent device.

Figure 7:
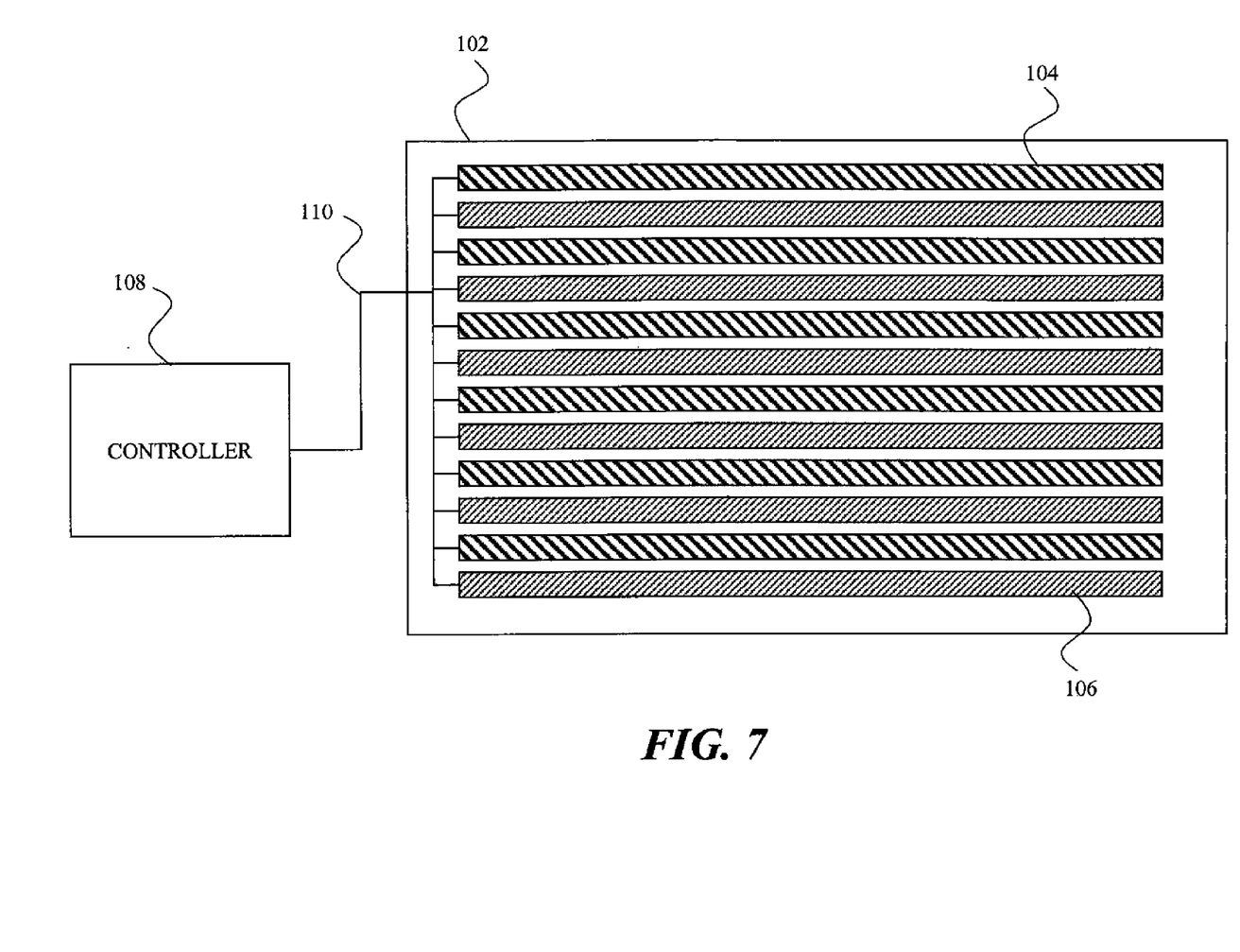
FIG. 7 is a schematic of an area illumination electro-luminescent device according to one embodiment of the present invention.

It should be noted that the examples within this disclosure employ multiple different core/shell quantum dot emitters, typically more than 5 and even more than 10. While all of these emitters may be coated between the first and second electrode layers, and while this may be the least expensive method of creating such a device, this coating method is not necessary. It is only necessary that any light-emitting elements be commonly addressed. One such alternative embodiment is shown in FIG. 7. As shown in this figure, an area illumination device 102 of the present invention is composed of two light emitting elements, 104 and 106. A first light-emitting layer may be deposited between a pair of electrodes to form a first type of light-emitting element 104. Similarly a second light-emitting layer may be deposited between a pair of electrodes to form a second type of light-emitting element 106. The light-emitting layers of these two light-emitting elements may each provide a subset of the different core/shell quantum dot emitters necessary to facilitate the present invention. However, these two light-emitting elements 104, 106 will be commonly addressed. That is, a single control signal will be provided over a control wire 110 from a controller 108 to simultaneously drive both of the two light-emitting elements 104, 106 with a common drive signal.

Figure 9:
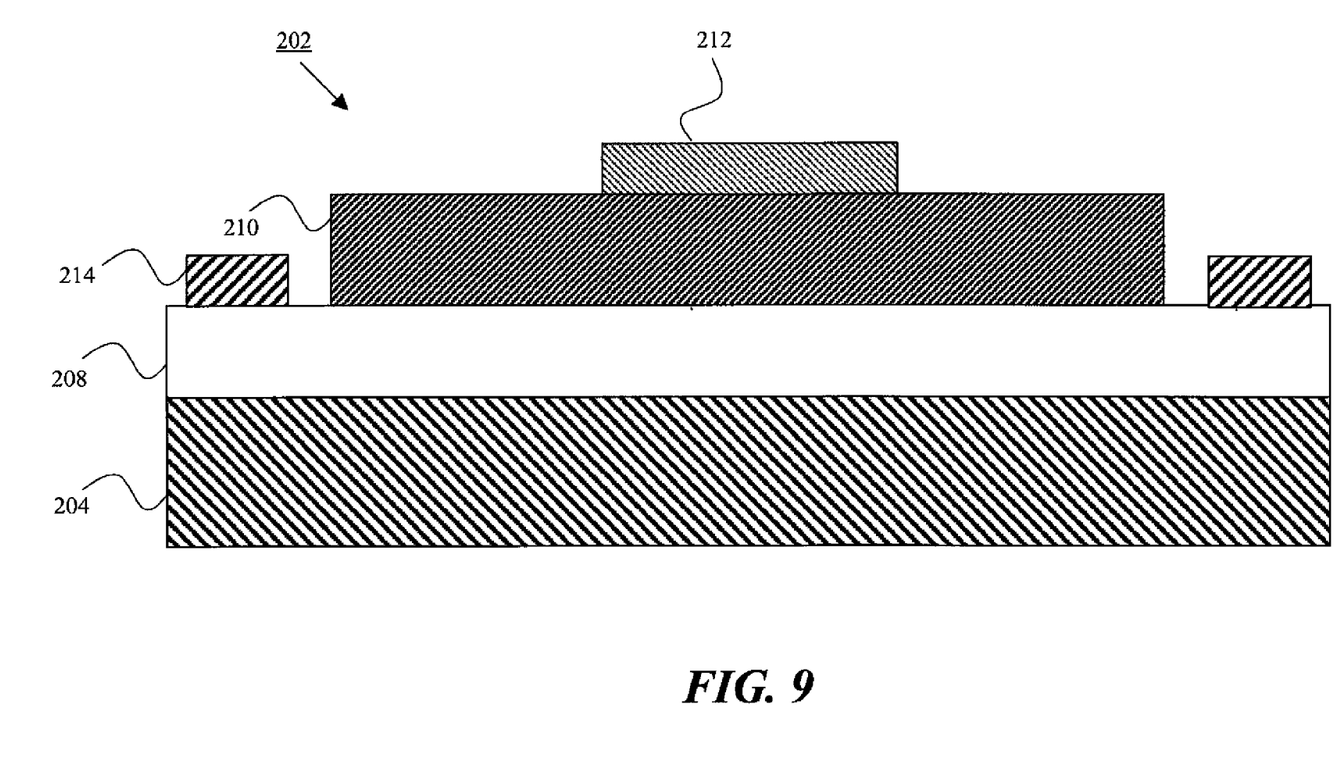
FIG. 9 is a cross section of an inorganic light-emitting diode according to one embodiment of the present invention.

In FIG. 9, an inorganic light-emitting diode 202 is shown that is useful in forming a light-emitting element of the present invention. As shown in this figure, the light-emitting diode 202 incorporates the quantum dot inorganic light-emitting layer 210. A substrate 204 supports the deposited semiconductor and metal layers. The substrate 204 should preferably be sufficiently rigid to enable the deposition processes so that it can withstand the thermal annealing processes (maximum temperatures of ~285° C.). Substrate 204 can be transparent or opaque. Possible substrate materials are glass, silicon, metal foils, and some plastics. The next deposited material is an anode 208. For the case where the substrate 204 is p-type Si, the anode 208 is deposited on the bottom surface of the substrate 204. A suitable anode metal for p-Si is Al. It can be deposited by thermal evaporation or sputtering. Following its deposition, it will preferably be annealed at 430° C. for 20 minutes. For all of the other substrate types named above, the anode 208 is deposited on the top surface of the substrate 204 and is comprised of a transparent conductor, such as, indium tin oxide (ITO). Sputtering or other well-known procedures in the art can deposit the ITO. The ITO is typically annealed at ~300° C. for one hour to improve its transparency. Because the sheet resistance of transparent conductors, such as, ITO, are much greater than that of metals, bus metal 214 can be selectively deposited through a shadow mask using thermal evaporation or sputtering to lower the voltage drop from the contact pads to the actual device. Inorganic light emitting layer 210 is deposited next. It can be dropped or spin cast onto the transparent conductor (or Si substrate). Other deposition techniques, such as, inkjetting the colloidal quantum dot-inorganic nanoparticle mixture is also possible. Following the deposition, the inorganic light-emitting layer 210 is annealed at a preferred temperature of 270° C. for 50 minutes. Lastly, a cathode 212 metal is deposited over the inorganic light-emitting layer 210. Candidate cathode 212 metals are ones that form an ohmic contact with the material comprising the inorganic nanoparticles 210. For example, in a case where the quantum dots are formed from ZnS inorganic nanoparticles, a preferred metal is Al. It can be deposited by thermal evaporation or sputtering, followed by a thermal anneal at 285° C. for 10 minutes. Those skilled in the art can also infer that the layer composition can be inverted, such that, the cathode 212 is deposited on the substrate 204 and the anode 208 is formed on the inorganic light emitting layer 210. In this configuration, when the substrate 204 is formed from Si, the substrate 204 is n-type Si.

Although not shown in FIG. 9, a p-type transport layer and an n-type transport layer may be added to the device to surround the inorganic light-emitting layer 210. As is well-known in the art, LED structures typically contain doped n- and p-type transport layers. They serve a few different purposes. Forming ohmic contacts to semiconductors is simpler if the semiconductors are doped. Since the emitter layer is typically intrinsic or lightly doped, it is much simpler to make ohmic contacts to the doped transport layers. As a result of surface plasmon effects, having metal layers adjacent to emitter layers results in a loss of emitter efficiency. Consequently, it is advantageous to space the emitter layers from the metal contacts by sufficiently thick (at least 150 nm) transport layers. Finally, not only do the transport layers inject electron and holes into the emitter layer, but, by proper choice of materials, they can prevent the leakage of the carriers back out of the emitter layer. For example, if the inorganic quantum dots in the light-emitting layer 210 were composed of $ZnS_{0.5}Se_{0.5}$ and the transport layers were composed of ZnS, then the electrons and holes would be confined to the emitter layer by the ZnS potential barrier. Suitable materials for the p-type transport layer include II-VI and III-V semiconductors. Typical II-VI semiconductors are ZnSe, ZnS, or ZnTe. Only ZnTe is naturally p-type, while ZnSe and ZnS are n-type. To get sufficiently high p-type conductivity, additional p-type dopants should be added to all three materials. For the case of II-VI p-type transport layers, possible candidate dopants are lithium and nitrogen. For example, it has been shown in the literature that $Li_3N$ can be diffused into ZnSe at ~350° C. to create p-type ZnSe, with resistivities as low as 0.4 ohm-cm.

Suitable materials for the n-type transport layer include II-VI and III-V semiconductors. Typical II-VI semiconductors are ZnSe or ZnS. As for the p-type transport layers, to get sufficiently high n-type conductivity, additional n-type dopants should be added to the semiconductors. For the case of II-VI n-type transport layers, possible candidate dopants are the Type III dopants of Al, In, or Ga. As is well known in the art, these dopants can be added to the layer either by ion implantation (followed by an anneal) or by a diffusion process. A more preferred route is to add the dopant in-situ during the chemical synthesis of the nanoparticle. Taking the example of ZnSe particles formed in a hexadecylamine (HDA)/TOPO coordinating solvent, the Zn source is diethylzinc in hexane and the Se source is Se powder dissolved in TOP (forms TOPSe). If the ZnSe were to be doped with Al, then a corresponding percentage (a few percent relative to the diethylzinc concentration) of trimethylaluminum in hexane would be added to the syringe containing TOP, TOPSe, and diethylzinc. In-situ doping processes like these have been successfully demonstrated when growing thin films by a chemical bath deposition. It should be noted the diode could also operate with only a p-type transport layer or an n-type transport layer added to the structure. Those skilled in the art can also infer that the layer composition can be inverted, such that, the cathode 212 is deposited on the substrate 204 and the anode 208 is formed on the p-type transport layer. For the case of Si supports, the substrate 204 is n-type Si.

The inorganic light-emitting layer 210 will preferably be comprised of a plurality of light-emitting cores, each core having a semiconductor material that emits light in response to a recombination of holes and electrons, each such light-emitting core defining a first bandgap; a plurality of semiconductor shells formed respectively about the light emitting cores to form core/shell quantum dots, each such semiconductor shell having a second bandgap wider than the first bandgap; and a semiconductor matrix connected to the semiconductor shells to provide a conductive path through the semiconductor matrix and to each such semiconductor shell and its corresponding light-emitting core so as to permit the recombination of holes and electrons.

At least one of the two electrodes (i.e., anode 208 or cathode 212) will typically be formed of a transparent or semi-transparent material such as ITO or IZO. The opposing electrode will often be formed of a highly reflective material such as aluminum or silver, but may also be transparent. In a typical embodiment, the anode will be transparent and the cathode will be reflective, but the opposing structure is also viable. The hole- and electron-transport materials may be formed from inorganic semi-conducting materials as described above, and alternatively may also be formed from organic semi-conducting materials. Additional layers may also be placed into the structure to promote other functions, such as electron and hole injection from the electrodes; or electron or hole blocking layers to prevent electrons or holes from traveling past the light-emitting layer to recombine with oppositely charged particles near one of the electrodes. An inorganic light-emitting diode as just described with reference to FIG. 6 can provide one or more light-emitting elements within the area illumination electro-luminescent device of the present invention.

A light-emitting element is defined herein as any electro-luminescent element that shares a pair of electrode segments and emits light. Light-emitting elements may contain a mixture of core/shell quantum dot emitters within a single light-emitting layer, the light-emitting elements may contain multiple light-emitting layers each containing one or more different core/shell quantum dot emitters and light-emitting elements may be comprised of separate light-emitting layers which include different core/shell quantum dot emitters that are formed between separate pairs of electrodes when these electrodes are commonly addressed.

Figure 8:
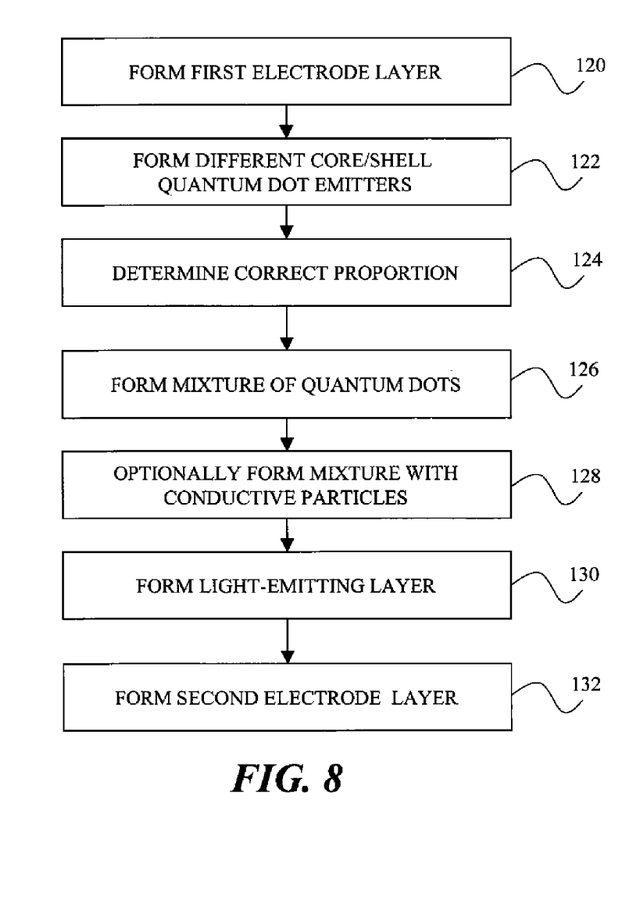
FIG. 8 is a flowchart of a method of making an area illumination electro-luminescent device according to one embodiment of the present invention.

A method of making an area illumination electro-luminescent device comprises the steps shown in FIG. 8. First the first electrode layer is formed 120 over a substrate. Next, a number of different core/shell quantum dot emitters are formed 122 that emit light having a spectral power distribution that includes a peak and a FWHM bandwidth, and wherein the peak wavelengths of the spectral power distributions of light produced by at least a subset of the different core/shell quantum dot emitters differ by a wavelength value equal to or less than the average FWHM bandwidth of the different core/shell quantum dot emitters within the range of 460 to 670 nm. One process for forming each of size of core/shell quantum dot emitters has been discussed in co-pending US Publication 2007/0057263, by Kahen, which is hereby included by reference in its entirety. Using this process core/shell quantum dot emitters of different sizes will be formed by varying the parameters of the reaction (e.g., time, temperature, or concentrations) that are used to form the core/shell quantum dot emitters. A correct proportion of each of the different core/shell quantum dot emitters will be determined 124 that, when combined will form a device with the desired spectral power distribution. Note that this spectral output may be checked using photoluminescence to insure the correct color is obtained with the addition of each different core/shell quantum dot emitter. A mixture containing the correct proportions of the different core/shell quantum dot emitters will then be formed 126 by combining the resulting core/shell quantum dot emitters into a common material to form a mixture containing core/shell quantum dot emitters from each of the size distributions. An optional operation 128 of forming a mixture of the two distributions or sizes of quantum dots with additional conductive inorganic particles may be performed. These additional conductive inorganic particles can, in some embodiments, be useful in forming a semi-conductor matrix, promoting the flow of holes and electrons to the quantum dots. A first light-emitting layer is then formed 130 over at least a portion of the first electrode layer by coating the mixture onto the first light-emitting layer. This layer can be dried and sintered to improve its conductivity. A second electrode layer is then formed 132 over the first and second light-emitting layers.

The method of making area illumination electro-luminescent device according to the present invention may include other optional steps. For example, a second light-emitting layer over at least a portion of the first electrode layer having a fixed ratio of a different subset of the number of different species of core/shell quantum dot emitters. In this instance, the first light-emitting layer may be formed over a portion of the first electrode layer to create a first type light-emitting element 104 as depicted in FIG. 7 and a second type of light-emitting layer may be formed over a separate portion of the first electrode layer to create a second light-emitting element 106. In such a device, it may be necessary to connect a controller 108 to the first and second electrode layers for adjusting the voltage or current provided to the light-emitting elements to obtain the desired color of light. This process of forming a light-emitting layer over at least a first portion the first electrode layer will further include forming a different colloidal mixture of core/shell quantum dots and an additional electrically conductive particle for deposition in the second light-emitting layer than was formed in the first light-emitting layer.

Other optional steps may include coating at least one common inorganic charge-transport layer within the area of each of the light-emitting layers. Often manufacturing such devices will include coating at least one common inorganic charge-transport layer over the first electrode layer prior to coating the electroluminescent materials and forming at least a second common inorganic transport layer over the light emitting layer 10, prior to forming the second electrode layer. Such charge-transport layers can be useful in promoting the flow of electrons and holes from the electrodes to the light-emitting layer, while preventing the creation of surface plasmons, which can reduce light emission from devices of the present invention.

The invention has been described in detail with particular reference to certain preferred embodiments thereof, but it will be understood that variations and modifications can be effected within the spirit and scope of the invention.

PARTS LIST

| | |
|---|---|
| 2 | device |
| 4 | substrate |
| 6 | light-emitting element |
| 8 | first electrode layer |
| 10 | light-emitting layer |
| 12 | second electrode layer |
| 22 | core/shell quantum dot emitter |
| 24 | core/shell quantum dot emitter |
| 26 | core/shell quantum dot emitter |
| 28 | core/shell quantum dot emitter |
| 30 | conductive particle |
| 40 | spectral power distribution |
| 42 | peak wavelength |
| 44 | FWHM bandwidth |
| 50 | spectral power distribution |
| 52 | spectral power distribution |
| 54 | spectral power distribution |
| 56 | spectral power distribution |
| 58 | spectral power distribution |
| 60 | spectral power distribution |
| 62 | spectral power distribution |
| 64 | spectral power distribution |
| 66 | spectral power distribution |
| 68 | spectral power distribution |
| 70 | spectral power distribution |
| 72 | spectral power distribution |
| 74 | spectral power distribution |
| 80 | spectral power distribution of device |
| 82 | spectral power distribution of standard daylight illuminant |
| 90 | spectral power distribution of incandescent lamp |
| 92 | spectral power distribution |
| 102 | area illumination device |
| 104 | first type of light-emitting element |
| 106 | second type of light-emitting element |
| 108 | controller |
| 110 | control wire |
| 120 | form first electrode layer step |
| 122 | form core/shell quantum dot emitters step |
| 124 | determine correct proportion step |
| 126 | form mixture step |
| 128 | optionally form mixture with conductive particles step |
| 130 | form first light-emitting layer step |
| 132 | form second electrode layer step |
| 152 | spectral power distribution of lamp |
| 154 | blackbody spectral power distribution |
| 160 | spectral reflectance function |
| 162 | spectral reflectance function |
| 164 | spectral reflectance function |
| 202 | inorganic light-emitting diode |
| 204 | substrate |
| 208 | anode |
| 210 | light-emitting layer |
| 212 | cathode |
| 214 | bus metal |

The invention claimed is:

1. An area illumination inorganic electro-luminescent device with a General Color Rendering Index of 80 or greater, comprising:
   a. a substrate;
   b. one or more commonly addressed, light-emitting elements, each commonly-addressed, light-emitting element including:
      b1) a first electrode layer formed over the substrate,
      b2) one or more light-emitting layers formed over the first electrode layer, and
      b3) a second electrode layer formed over the light-emitting layer;
   c. wherein the one or more light-emitting layers include five or more different distributions of different core/shell quantum dot emitters, each distribution of different core/shell quantum dot emitters emitting a different colored light having a spectral power distribution, each spectral power distribution including a peak wavelength and a FWHM bandwidth and wherein the peak wavelengths of the spectral power distributions of light produced by at least two of the five or more different distributions of different core/shell dot emitters are separated by a distance between the peak wavelengths such that the minimum of the separation distances between any two peak wavelengths of the respective spectral power distributions is less than or equal to 1.1 times the average FWHM bandwidth between 460 and 670 nm, and such that the electro-luminescent device produces white light having a General Color Rendering Index of 80 or greater; and
   d. wherein the five or more different distributions of different core/shell quantum dot emitters are in a common light-emitting layer.

2. The area illumination inorganic electro-luminescent device of claim 1, wherein each light-emitting layer has the same set of different core/shell quantum dot emitters.

3. The area illumination inorganic electro-luminescent device of claim 1, wherein the spectral power distribution of light produced by each of the different core/shell quantum dot emitters has a FWHM bandwidth of 50 nm or less.

4. The area illumination inorganic electro-luminescent device of claim 1, wherein the spectral power distribution of the device matches a CIE daylight power spectral power distribution.

5. The area illumination inorganic electro-luminescent device of claim 4, wherein the spectral power distribution of the device matches a CIE daylight spectral power distribution, and wherein the light-emitting layer additionally is comprised of at least two additional core/shell quantum dot emitters that emit light having a spectral power distribution with a peak wavelength less than 460 nm and at least one peak wavelength greater than 670 nm.

6. The area illumination inorganic electro-luminescent device of claim 1, wherein the FWHM bandwidth is approximately 30 nm and wherein the light-emitting layer includes 13 or more different core/shell quantum dot emitters which produce light having spectral power distributions with different peak wavelengths.

7. The area illumination inorganic electro-luminescent device of claim 1, wherein the spectral power distribution of the device matches the spectral power distribution of an incandescent lamp.

8. The area illumination inorganic electro-luminescent device of claim 2, wherein the spectral power distribution of the device is designed to match the spectral power distribution of a black body radiator.

9. The area illumination inorganic electro-luminescent device of claim 3, wherein the RMSE between the spectral power distribution of the device and a near blackbody radiator is less than $1 \times 10^{-3}$ when this RMSE is calculated between the defined spectral power distribution and the spectral power distribution of a daylight or near blackbody emitters having an equivalent correlated color temperature, and wherein the two spectral power distributions have the same integrated power spectral power between 350 and 750 nm.

* * * * *